(12) United States Patent
Gao

(10) Patent No.: US 11,791,240 B2
(45) Date of Patent: Oct. 17, 2023

(54) HIGH PERFORMANCE BASEBOARD COOLING ARCHITECTURE

(71) Applicant: BAIDU USA LLC, Sunnyvale, CA (US)

(72) Inventor: Tianyi Gao, San Jose, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 21 days.

(21) Appl. No.: 17/134,831

(22) Filed: Dec. 28, 2020

(65) Prior Publication Data

US 2022/0208647 A1   Jun. 30, 2022

(51) Int. Cl.
*H01L 23/473* (2006.01)
*H05K 7/20* (2006.01)

(52) U.S. Cl.
CPC ....... *H01L 23/473* (2013.01); *H05K 7/20145* (2013.01); *H05K 7/20163* (2013.01); *H05K 7/20254* (2013.01)

(58) Field of Classification Search
CPC ...... G06F 1/20; G06F 2200/201; G06F 1/203; G06F 1/187; G06F 1/1656; H01L 23/473; H01L 23/467; H01L 23/427; H01L 35/30; H05K 7/20145; H05K 7/20163; H05K 7/20254; H05K 7/20772; H05K 7/20781; H05K 7/20336; H05K 7/20736; H05K 7/20509; H05K 7/20809; H05K 7/20727
See application file for complete search history.

(56) References Cited

U.S. PATENT DOCUMENTS

| | | | |
|---|---|---|---|
| 7,254,033 B2* | 8/2007 | Jafari | H01L 23/467 361/705 |
| 9,257,364 B2* | 2/2016 | Ahuja | H01L 21/4882 |
| 10,365,667 B2* | 7/2019 | Lyon | G05D 7/0635 |
| 2003/0042003 A1* | 3/2003 | Novotny | H05K 7/20172 165/47 |
| 2004/0250992 A1* | 12/2004 | Aoki | H05K 7/20727 165/80.4 |
| 2005/0167802 A1* | 8/2005 | Hirano | H01L 25/072 257/E23.092 |
| 2006/0161311 A1* | 7/2006 | Vinson | G06F 1/20 361/696 |
| 2007/0089859 A1* | 4/2007 | Wei | H01L 23/473 257/E23.098 |
| 2008/0046617 A1* | 2/2008 | Lee | G06F 13/409 710/104 |
| 2008/0084667 A1* | 4/2008 | Campbell | H05K 7/20736 165/80.4 |

(Continued)

*Primary Examiner* — Adam B Dravininkas
(74) *Attorney, Agent, or Firm* — WOMBLE BOND DICKINSON (US) LLP

(57) ABSTRACT

A vertical architecture for incorporating cooling devices onto a baseboard. The architecture forms four layers: baseboard, electronic device layer, contact layer, and cooling layer. In the electronic device layer multiple electronic chips of different characteristics are mounted onto the baseboard. In the contact layer multiple contact devices are attached to the electronic chips to match the form factor of the chips to the respective cooling device and to function to transfer heat from the chip to the respective cooling device. In the cooling layer multiple cooling devices are used to extract the heat using passive or active air cooling, liquid cooling, or hybrid and/or phase change cooling.

14 Claims, 5 Drawing Sheets

(56) References Cited

U.S. PATENT DOCUMENTS

| | | | |
|---|---|---|---|
| 2011/0228485 A1* | 9/2011 | Usui | H05K 7/20509 |
| | | | 361/720 |
| 2013/0228313 A1* | 9/2013 | Fried | F28D 15/0266 |
| | | | 165/104.26 |
| 2013/0258599 A1* | 10/2013 | Danello | H01L 23/433 |
| | | | 361/706 |
| 2019/0027424 A1* | 1/2019 | Mira | H01L 23/433 |
| 2019/0051615 A1* | 2/2019 | Nair | H01L 21/4857 |
| 2021/0259134 A1* | 8/2021 | Uppal | H01L 23/10 |

* cited by examiner

HIGH PERFORMANCE BASEBOARD COOLING ARCHITECTURE

FIELD OF THE DISCLOSURE

Embodiments of the present disclosure relate generally to architecture for cooling of devices mounted onto a baseboard and, more particularly, to a modular architecture enabling versatility in air and/or liquid cooling of different devices mounted onto the baseboard.

BACKGROUND

Generally, different semiconductor devices (chips or dies) to be mounted onto a baseboard have different cooling requirements. Therefore, different solutions for heat transfer and removal have been developed for different chip requirements. Such an approach leads to competing requirements on real estate and access to air flow, wherein cooling solution for one chip may block or interfere with access to heat removal from a neighboring chip. Also, the physical size of the cooling elements may dictate reduce density of chips on the baseboard, thus requiring more space to achieve the needed performance.

The current approach to designing individual cooling solution for each individual chip also leads to the requirement to design new cooling solution for each new baseboard layout. Such an approach inevitably leads to reduced interoperability and resilience of the cooling solution. Given the fast changes of the hardware platforms and chip technologies, a proper and efficient solution should be able to stay at a similar cooling architecture, with perhaps only a few updates to some of the cooling devices or components.

Liquid cooling and hybrid cooling are critical solutions for high power-density electronics thermal management. This is the case not only for data centers, but also other areas, such as edge computing. With the deployment of 5G technology, more compute and storage workload is required to be processed closer to the end users instead of processing in a core data center or a central cloud environment. One of the examples is edge computing for autonomous vehicles. On an autonomous vehicle, multiple sensors are assembled and the data collected by these sensors and devices need to be processed locally using different types of processors. Therefore, on-vehicle computing hardware is needed. The capability requirement of on-vehicle computing hardware is critical and it is constantly increasing as features and accuracy requirements are added to the autonomous vehicle system. Consequently, the thermal design becomes challenging as it needs to satisfy different electronic devices with different TDP (thermal design power) and thermal specifications. In addition, such computing hardware may impose more challenging requirements on the mechanical and structural design of the cooling solutions.

A new approach is required for thermal budget management of the various devices on a baseboard, which offers ease of adaptation to new baseboard layouts, provides reliability, and enables improved serviceability, and prevents interference among the various cooling technologies used on the baseboard.

BRIEF DESCRIPTION OF THE DRAWINGS

Embodiments of the invention are illustrated by way of example and not limitation in the figures of the accompanying drawings in which like references indicate similar elements.

FIG. 6 is a side view of an embodiment illustrating baseboard cooling design, while

DETAILED DESCRIPTION

Figure 1:
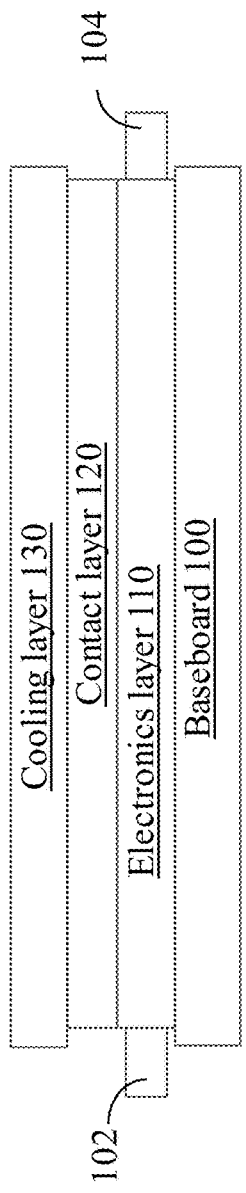
FIG. 1 is a general schematic illustrating a side view of the vertical cooling architecture according to an embodiment.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

The following detailed description provides examples that highlight certain features and aspects of the innovative baseboard cooling architecture claimed herein. Different embodiments or their combinations may be used for different applications or to achieve different results or benefits. Depending on the outcome sought to be achieved, different features disclosed herein may be utilized partially or to their fullest, alone or in combination with other features, balancing advantages with requirements and constraints. Therefore, certain benefits will be highlighted with reference to different embodiments, but are not limited to the disclosed embodiments. That is, the features disclosed herein are not limited to the embodiment within which they are described, but may be "mixed and matched" with other features and incorporated in other embodiments.

The current disclosure introduces a modular design and architecture that enables flexible configuration of baseboard cooling for servers operating in data centers, edge computing, etc. Disclosed embodiments provide a solutions that can be easily adaptable to different baseboard designs and employ different types of fluids for heat transfer and removal. In the context of this disclosure, the term baseboard is used for shorthand meant to cover all printed circuit boards that are loaded with microchips, sometimes also referred to as motherboard, mainboard, system board, logic board, etc.

Disclosed embodiments include cooling architecture especially suitable for high performance baseboard that include both air cooled and liquid cooled electronics. The architecture introduces a stacking design of the cooling system, wherein different functions are assigned to different layers of the stack. The architecture segregates the design of the cooling system and the electronics board, which means that while the cooling system continues to function and manage the thermal budget, there's no dependency on the electronics board in terms of its board layout, space availability, and so on. This stacking approach incorporates a cooling layer and a contact layer. The cooling layer enables ease of design for performance optimization for both air and liquid cooling, while the contact layer is designed for ease of implementation and increase in system interoperability. The cooling layer can be used to implement different cooling technologies, based on the thermal/power map of the entire baseboard. This vertical design approach is an effective solution for solving complex board layouts, especially in cases where the boards are tightly packaged with electronic components at different power ratings, form factor, and thermal requirements. In addition, the segregation of the cooling and electronics improves the reliabilities of both the electronics and the cooling equipment.

Disclosed embodiments provide new approach for electronics printed circuit board cooling architecture. The design considers the entire board-level cooling being integrated into a cooling layer, which is mounted onto the board via an intermediate contact layer. Different cooling technologies, cooling designs and cooling devices are integrated on the cooling layer. The cooling design and cooling devices assembled on the cooling layer follow the dedicated cooling design method. The method makes efficient utilization of the cooling medium, for both airflow and liquid flow. The contact layer is used to assist the assembly of the cooling layer and for heat transfer from the electronic devices to the cooling layer. The contact layer can be either integrated into the cooling layer or attached onto the electronics. Overall, the proposed cooling architecture provides an efficient system structure and hardware design for implementing different types of electronics cooling methods, and at the same time provides high operating efficiency in a combination of mixed cooling methods and cooling architectures.

Disclosed embodiments also provide a method for designing baseboard thermal management in a segregated fashion, in that the method decouples the design of the baseboard layout and cooling layout, while bridging the two using the contact layer. Since the design of the cooling layer is separated from the design of the baseboard, it improves design flexibility and vendor collaborations, including system vendor, cooling integration vendor and component providers. Moreover, since the entire baseboard cooling is relegated to the cooling layer, the entire cooling arrangement can be tested prior to integration with the baseboard. For example, functional, performance and partial reliability tests can be performed on the cooling and contact layers independently of the baseboard and prior to integration with the baseboard. This means that the entire cooling solution can be tested, verified and certified prior to shipping for integration with the baseboard.

FIG. 1 is a general schematic illustrating a side view of the vertical cooling architecture according to an embodiment. Shown in this embodiment are the baseboard 100, the electronics layer 110, the contact layer 120 and the cooling layer 130. Element 102 indicates an optional scale-out interface, while element 104 indicates an optional communication interface. Baseboard 100 may be any standard baseboard that has multiple electronic devices mounted thereupon—illustrated schematically as electronics layer 110. Conventionally, each of the electronic devices would require its own cooling device, which is designed without regards to the requirements of neighboring devices. Thus, the conventional approach complicates the overall board design and real estate allocation, which is obviated by the illustrated vertical architecture.

The cooling layer 130 is designed based on the entire board according to analysis of the board level power conditions and implementing different cooling technologies, such as liquid cooling for major high power density components, active air cooling for less power density components, and passive air cooling for other low power density components. For liquid cooling, the cooling layer 130 may include liquid cooled cold plates, loops and other components. For active air cooling the cooling layer 130 may use heat sinks, thermosiphon devices, and dedicated fans. For passive air cooling, the cooling layer 130 may use centralized fans, such as data center room level air blowers or cooling unit blowers, as well as ducting and air baffles for airflow management. Consequently, the cooling arrangement is completely decoupled from the baseboard.

The contact layer 120 assists in transferring the heat from the electronics layer 110 to the cooling layer 130. The contact layer 120 provides structural level functionality for implementation, since the height and vertical locations/orientations of the different electronic components may not match each other. The contact layer 120 also functions as heat transfer conduit and may incorporate advanced cooling technologies for lowering thermal resistance and enhancing the heat transfer. Note that with this vertical design concept, not only the hardware is arranged vertically, but the airflow is managed in vertical manner as well.

The embodiment illustrated in FIG. 1 provides general overview of the design approach. It also shows a key design concept introduced herein, which decouples the cooling system from the board and each individual electronics using the design layers as well as the vertical stacking. The description will now turn to variations and enhancement that may be incorporated in the new design approach, starting with FIG. 2, which provides more details regarding the contact and cooling layers.

Figure 2:
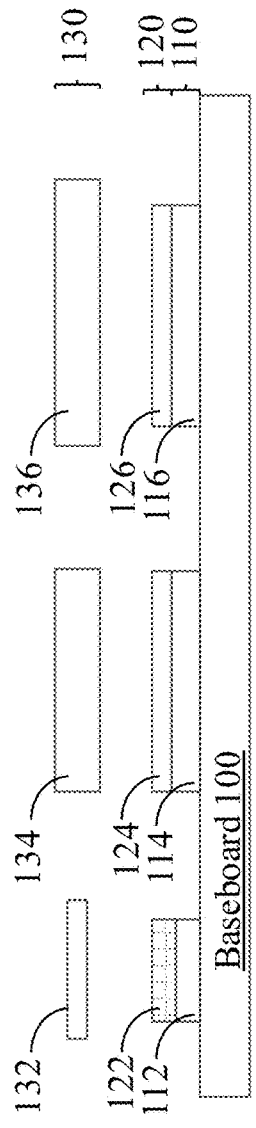
FIG. 2 illustrates a general schematic illustrating a partially-exploded side view of a vertical cooling arrangement according to an embodiment.

FIG. 2 is a partial exploded side-view of an embodiment illustrating additional details of the vertical cooling architecture. As shown, different electronic devices 112, 114 and 116 are mounted onto baseboard 100 and form the electronics layer 110. These devices may include GPU, CPU, ASIC high performance memory, Chiplets based SIP, control and management chips, etc. The manufacturer of each of these chips may specify different operational temperatures for these chips. Therefore, different cooling devices, 132, 134 and 136, on the cooling layer 130 are used to remove heat from the different electronic devices. The contact layer 120 forms an intermediate heat transfer medium to transfer the heat from each electronic device to its corresponding cooling device. Since the electronic devices and the cooling devices have different physical dimensions, and since different arrangements may require different specified cooling transfer rate, the individual contact devices 122, 124 and 126 may be of different form factor and different structure. For example, any of the contact elements 122, 124 and 126 may be standard stiffeners or heat spreader, high conductivity plates, vapor chamber stiffener, etc. In some embodiments the contact layer may also provide additional cooling enhancement. For example, one or more of the contact elements can be cooling enhancement device, which has higher heat transfer coefficient than the other contact elements. For example, contact device 122 has a higher heat transfer coefficient than contact elements 124 and 126.

A stiffener is generally made of copper or alloy steel and placed around the die and a heat spreader is then attached over the die and the stiffener. A heat spreader is a metal cover placed in contact with the chip to provide a path for heat spreading. High conductivity plates are heat spreaders with embedded heat pipes to transport heat. Vapor chamber is a thin planar phase-changing heat transfer device. A common property of these contact elements is that they function to transfer heat flux and to transport heat from hotter side to cooler side, i.e., enhance the transport of heat from one side of the element to its opposite side, in this case from the hot side contacting the chip to the cold side contacting the cooling element. For example, the vapor chamber stiffener may be used to assist in scenarios where the power of the dies and the cooling unit capabilities mismatch by improving the overall heat transfer coefficient from the chip to the cooling medium. This can happen, e.g., when the bare die power increases and/or the specified Tcase value is decreased. Tcase stands for case temperature, and different chips may have different maximum Tcase temperatures allowed during normal operation.

The cooling devices, 132, 134 and 136, may employ passive air cooling, active air cooling, liquid cooling, hybrid cooling, etc. Using both the cooling layer 130 and the contacting layer 120 provides flexibility for the configuration and design of the total cooling solution. The cooling layer 130 and the contacting layer 120 can be combined to adapt to different baseboards. Also, the various contacting devices can be assembled with their corresponding electronic devices and provided by the chip vendor as integrated product to be installed on the baseboard.

Figure 3:
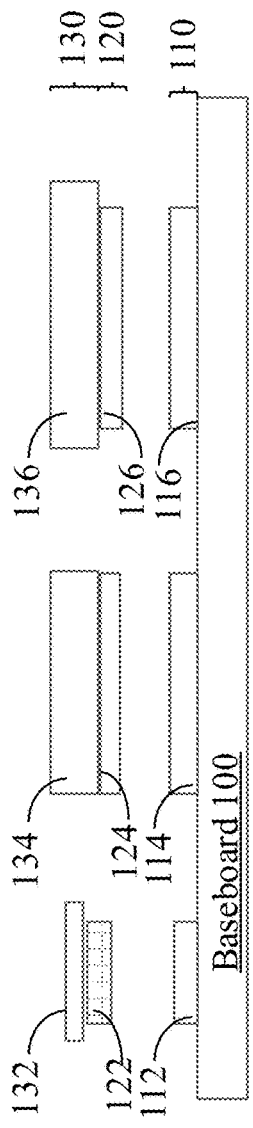
FIG. 3 is a general schematic illustrating a partially-exploded side view of an example of an approach wherein the contact layer is integrated with the device layer, according to disclosed embodiments.

FIG. 2 illustrates the case wherein the contact devices are first attached to the electronic devices, such that the baseboard is in essence loaded with the electronic devices and the contact devices, and then the cooling devices are added on top of the contact devices. Conversely, FIG. 3 illustrate the case wherein the baseboard is loaded with bare electronic devices (dies) and the contact layer 120 is attached to, or integrated with, the cooling layer 130. Thus, in the embodiment of FIG. 3 each contact device is pre-attached to its corresponding cooling device.

FIGS. 2 and 3 also show different system integration assembly methods. Due to the vertical stacking approach disclosed herein, the contact layer 120 can be preassembled with the electronic layer 110 or preassembled with the cooling layer 130. Generally the electronic devices and the cooling devices are provided by different vendors, so the vertical stacking approach provide flexibility in vendor selection and assignments. For example, if the contact layer is preassembled with the electronics layer 110, this can be done by the system vendor who builds and assembles the baseboard. Conversely, when the contact layer is preassembled with the cooling layer 130, this can be done by the cooling vendor. This is improves the product design efficiency and solution interoperability. Since both the system vendor side (such as OEM) and the cooling system design vendor can build different types of cooling layers with different functions/capabilities to improve the corresponding adaptabilities of both the baseboard and cooling system. This also simplified the integration of the cooling layer onto the baseboard, with the contact layer functioning as an adaptation layer.

Figure 4:
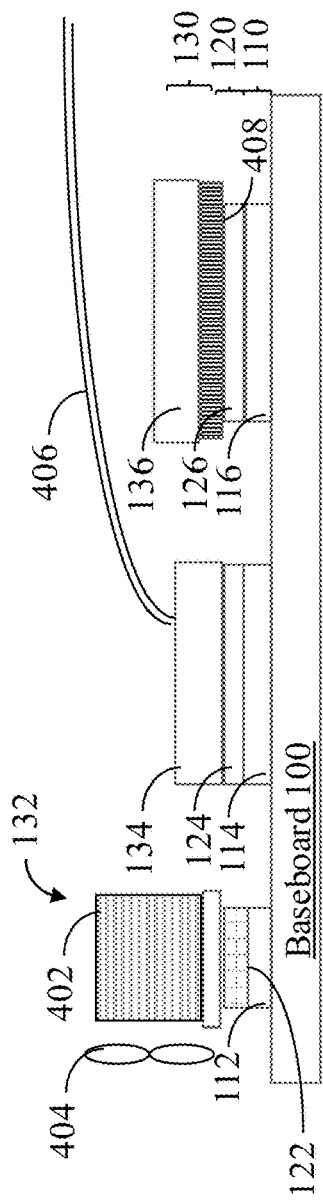
FIG. 4 illustrates an example of different cooling devices incorporated in the cooling layer, according to disclosed embodiments.

FIG. 4 illustrates an assembled arrangement wherein the cooling layer includes different cooling devices, some air-based and some liquid-based. For example, cooling device 132 incorporates a heatsink 402 (which may include fins) and a dedicated fan 404. Conversely, cooling device 134 includes a liquid cooling plate connected to cooling fluid pipes 406. The pipes 406 circulate cooling liquid from a cooling system (See, e.g., FIG. 8). The embodiment illustrated in FIG. 4 also includes a TEC 408 as part of cooling device 136, but it may instead be part of the contact device 126. TEC is a thermoelectric cooler that uses the Peltier effect to pump heat flux from one side to the opposite side depending the device design and specification, as well as implementation method. The TEC is a solid-state active heat pump which transfers heat from one side of the device to the other.

Note that in the sense of the disclosed embodiments, the contact layer functions to transport heat from the electronic devices to the cooling devices, while the cooling devices remove the heat using fluid media, such as air or cooling liquid. Thus, a TEC may be thought of as a contact device which transfers heat to a cooling device. However, as the TEC requires power and control circuitry, it may be installed with its control circuitry in the cooling layer. Conversely, it may receive its power and control signals from the baseboard, and thus be installed in the contact layer.

As can be seen from the above description, by having a separate contact layer, the flexibility in the design of the cooling system is enhanced. The contact layer may assist in the cooling layer implementation by, e.g., facilitating matching of different form factors of the chips and the cooling devices. In one example, the different contact elements are used to bridge height differences among the different dies mounted onto the baseboard. Thus, the contact layer may function as an adaptation layer between the electronic device layer and the cooling layer. The contact layer may also assist in enhancing the cooling performance of the cooling devices. For example, vapor chamber based stiffeners may be used to enhance the heat transfer such that the temperature difference between the cooling medium and hot side (such as Tcase) can be lower at the same amount of heat flux rate. In this sense, the contact devices may be referred to as heat transport enhancement devices, while the cooling devices may be referred to as heat removal devices. Therefore, the disclosed vertical architecture incorporates a heat transport layer and a heat removal layer.

In any of the embodiments disclosed herein, the various fan control circuits, and other capacitance, resistance, and electronic elements may be packaged in the cooling layer. This improves the design efficiency as well as the operating reliability as the same arrangement can be used for multiple generations of baseboards. Note, however, that the pairing of various contact devices with cooling devices as illustrated herein is exemplary only, and different pairing may be used depending on the specification of each particular electronic device. For example, elements such as TEC, vapor chamber stiffener, etc., may be paired with either air or liquid cooling devices.

Figure 5:
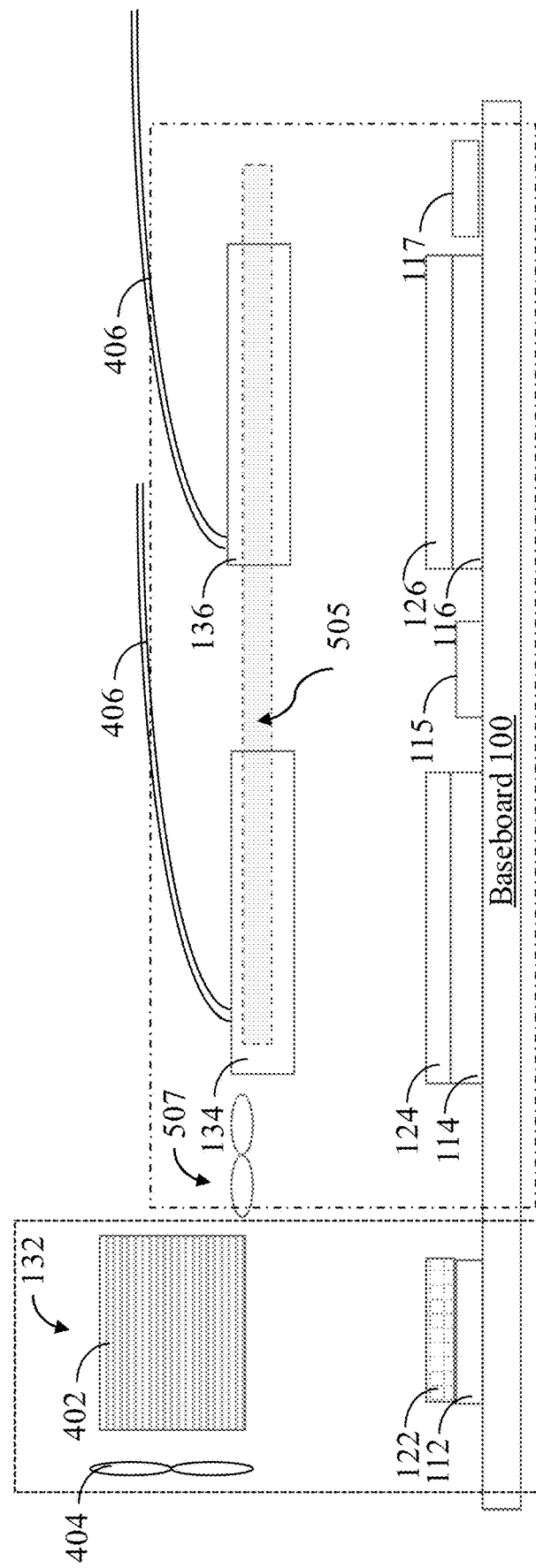
FIG. 5 is a general schematic illustrating a partially-exploded side view of an example of a cooling design incorporating horizontal and vertical air flow, according to an embodiment.

FIG. 5 illustrates how different cooling solutions can be applied to different sections of the baseboard. In the example of FIG. 5, the dash-line box indicates that cooling device 132, that includes heat sink 402 and dedicated fan 404 are dedicated to cooling electronic device 112, with the vapor chamber stiffener 122 enhancing heat flux from device 112.

Conversely, the dash-dot box indicates a cooling solution for electronic devices 114, 115, 116 and 117. This solution includes liquid-cooled plates 134 and 136 having liquid pipes 406 circulating cooling liquid therein. Also a dedicated fan 507 delivers air flow through channel or passage 505 in between the liquid cooled plates.

In one embodiment, fan 507 is dedicated to delivering air flow for air cooling devices 115 and 117 via passage 505. That is, since the cooling layer can be designed independently of the device layer layout, the cooling devices can be arranged such that air flow channels or passages can be created among the cooling devices to allow delivering air flow to various electronic devices and sections of the baseboard. This avoids the prior art problem where, for example, electronic devices 114 and 116 may block air flow from reaching device 115 or 117.

Note that in FIG. 5 fans 404 and 507 operate independently and generate different air flow for different purposes. Fan 404 generates a horizontal air flow for removing heat from the heat sink 402. Fan 507, on the other hand, generates a vertical air flow, which is directed among the liquid cooled plates. Since each fan is dedicated to an independent cooling solution, each fan can be designed and operated independently of the other cooling solutions and fans.

Figure 6:
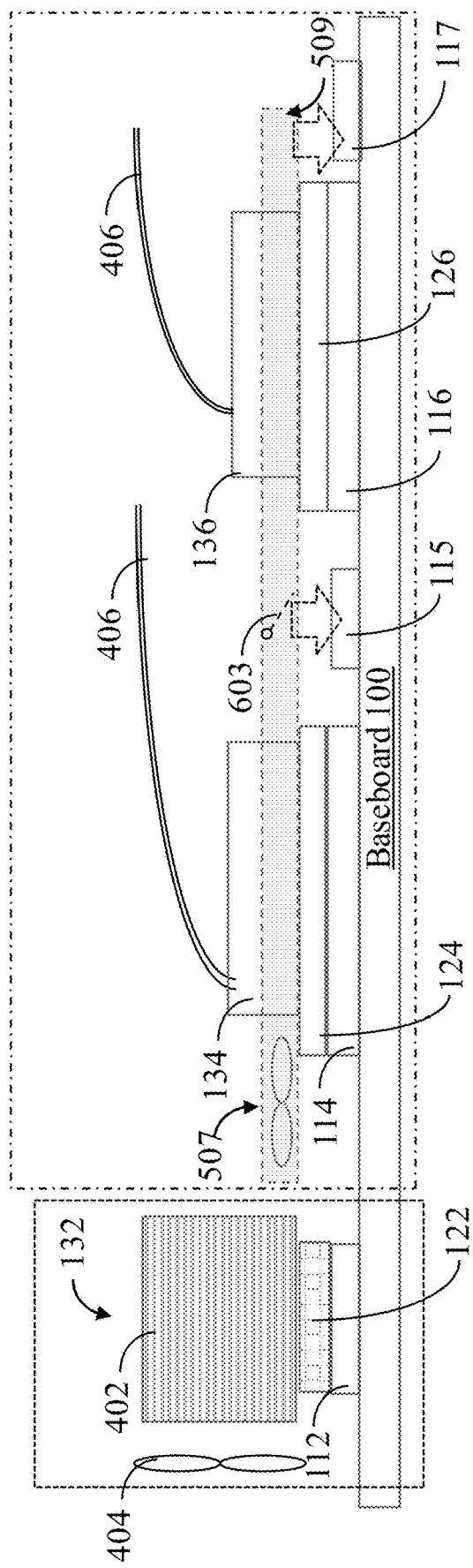
Figure 7:
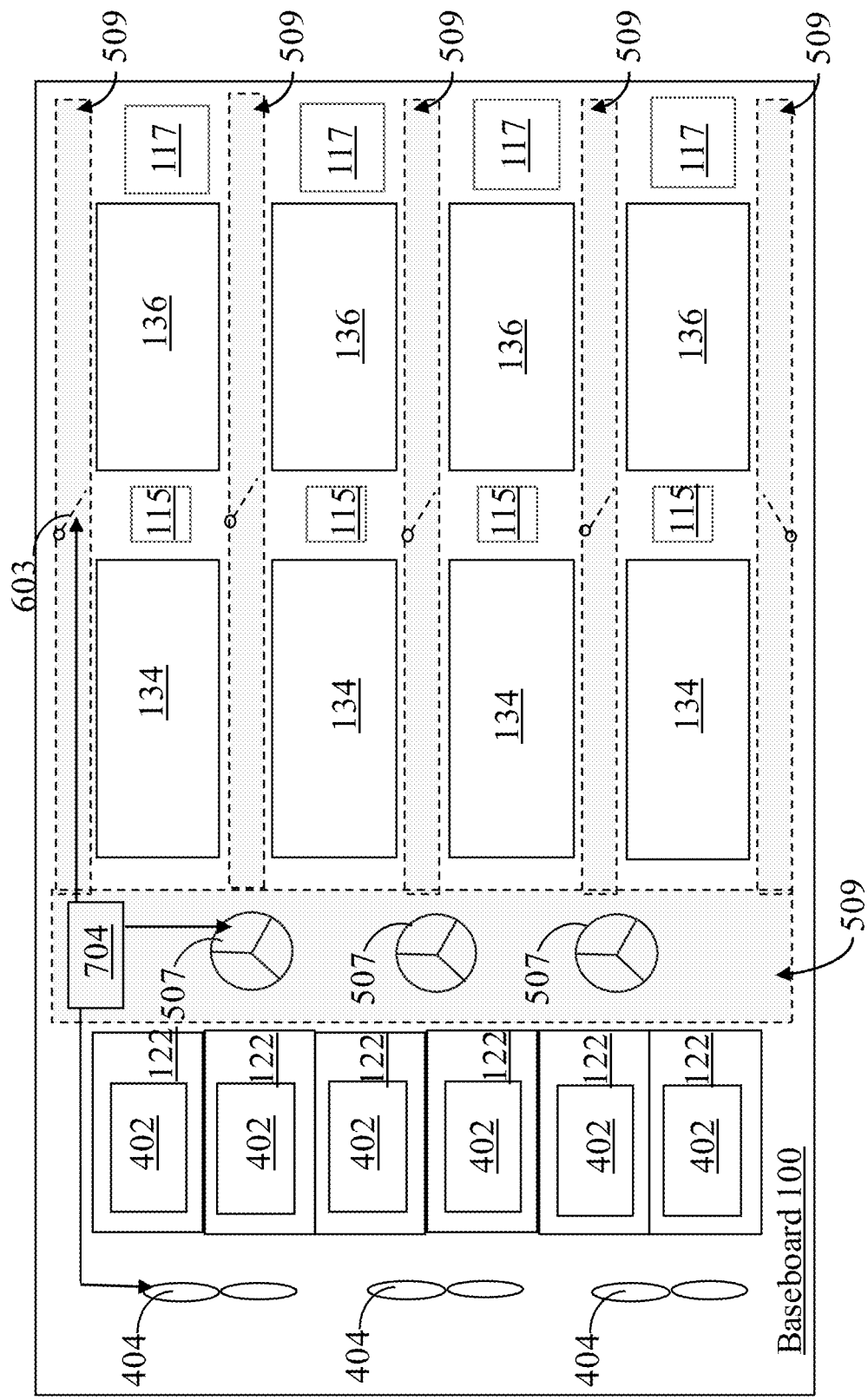
FIG. 7 is a top view thereof.

FIG. 6 is a side view of an assembled embodiment illustrating baseboard cooling design, while FIG. 7 is a top view thereof. The embodiment is similar to that of FIG. 5, except that air flow is controlled by use of ducts 509, such that on the one hand air flow is delivered to each element that requires it, while on the other hand air flow from one cooling section does not intermingle or interferes with air flow of another solution. For example, fans 404 generate air flow for the heat sinks 402 without interference with the air flow generated by fans 507, or the interference is minimized. This enables localized cooling design that can be easily integrated with other cooling devices on the board without worries of interfering elements.

Also, the provision of ducts in the cooling layer enables delivery of air flow to locations that may be otherwise obscured by other elements or structures. For example, one fan 507 may be integrated with ducts to deliver air flow to device 115, while another fan 507 may be integrated with ducts to deliver air flow to device 117, which are otherwise blocked by components 114 and 116 and/or plates 134 and 136. FIG. 6 also illustrates by the doted arrow that provisions can be made to divert air flow to electronic devices 115 that are not provided with dedicated contact element and/or cooling element. For example, baffle 603 may be controlled to divert air flow to different areas of the baseboard, dedicated for device 115 in one embodiment.

FIG. 7 also illustrates the provision of control electronics 704 in the cooling layer. The control electronics may be used to control the fans 507, 404, the baffles 603, and any other elements in the cooling and/or contact layer. The control electronics may also include sensors, such as temperature sensor and leak detection sensors to detect potential leaks from the liquid cooling plates.

With the disclosed embodiments, a baseboard cooling architecture is provided which is designed in layers which are stack on the top of each other. This vertical layering enables to easily mix cooling devices and cooling technologies in the cooling layer, which results in minimum impact or interference among each other. The cooling media streams, especially the cooling airflow, are managed in layers as well. For example, the cooling air above the cooling layer frame can used for cooling the devices on one side of the baseboard, while cooling air passing blow the cooling layer frame can be used for cooling all the electronics which are not directly attached with any components on the cooling layer. This portion of the air can be driven by the fans through ducts and channels, and divert by air baffles to the appropriate areas of the baseboard. Additional air channels can be also used for assisting airflow management on the top of the cooling layer to improve cooling management and performance.

Figure 8:
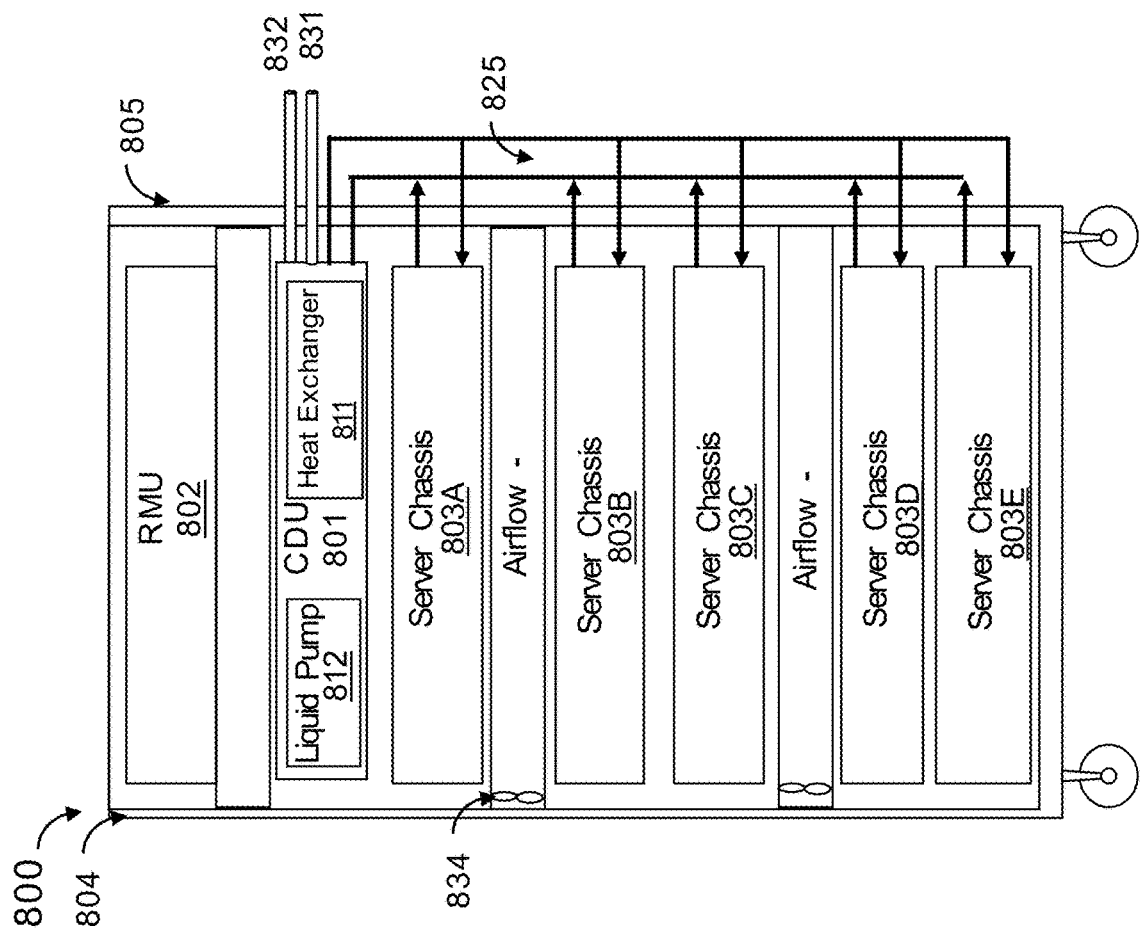
FIG. 8 is a side view of a server rack according to an embodiment.

FIG. 8 illustrates an electronic rack incorporating cooled baseboards according to an embodiment. Electronic rack 800 may represent any electronic rack conventionally used in data centers or edge computing facility. According to one embodiment, electronic rack 800 includes, but is not limited to, coolant distribution unit (CDU) 801, rack management unit (RMU) 802, and one or more server chassis 803A-803E (collectively referred to as server chassis 803). Server chassis 803 can be inserted into an array of server slots (e.g., standard shelves) respectively from frontend 804 or backend 805 of electronic rack 800. Note that although there are five server chassis 803A-803E shown here, more or fewer server chassis may be maintained within electronic rack 800. Also note that the particular positions of CDU 801, RMU 802, and/or server chassis 803 are shown for the purpose of illustration only; other arrangements or configurations of CDU 801, RMU 802, and/or server chassis 803 may also be implemented. In one embodiment, electronic rack 800 can be either open to the environment or partially contained by a rack container, as long as the cooling fans 834 can generate airflows from the frontend to the backend.

In addition, for at least some of the server chassis 803, an optional fan module (not shown) is associated with the server chassis. Each of the fan modules includes one or more cooling fans. The fan modules may be mounted on the backends of server chassis 803 or on the electronic rack to generate airflows flowing from frontend 804, traveling through the air space of the sever chassis 803, and existing at backend 805 of electronic rack 800.

In one embodiment, CDU 801 mainly includes heat exchanger 811, liquid pump 812, and a pump controller (not shown), and some other components such as a liquid reservoir, a power supply, monitoring sensors and so on. Heat exchanger 811 may be a liquid-to-liquid heat exchanger. Heat exchanger 811 includes a first loop with inlet and outlet ports having a first pair of liquid connectors coupled to external liquid supply/return lines 831-832 to form a primary loop. The connectors coupled to the external liquid supply/return lines 831-832 may be disposed or mounted on backend 805 of electronic rack 800. The liquid supply/return lines 831-832, also referred to as room liquid supply/return lines, may be coupled to an external cooling system of the computing facility.

In addition, heat exchanger 811 further includes a second loop with two ports having a second pair of liquid connectors coupled to liquid manifold 825 (also referred to as a rack manifold) to form a secondary loop, which may include a supply manifold (also referred to as a rack liquid supply line or rack supply manifold) to supply cooling liquid to server chassis 803 and a return manifold (also referred to as a rack liquid return line or rack return manifold) to return warmer liquid back to CDU 801. Note that CDU 801 can be any kind of CDUs commercially available or customized ones. Thus, the details of CDUs 801 will not be described herein.

Each of server chassis 803 may include one or more IT components, wherein at least some of the IT components comprise a vertical cooling arrangement as disclosed herein, including a baseboard, a plurality of electronic devices mounted onto the baseboard, a contact layer over the electronic devices, and a cooling layer over the contact layer. The cooling layer may include liquid cooling devices that may receive cooling liquid from CDU 801 via liquid manifold 825. The cooling layer may include passive and/or active air cooling devices that may employ the airflow provided by the rack cooling fans 834.

With the above disclosure, a baseboard with integrated cooling is provided, comprising: a baseboard; a plurality of electronic devices mounted onto the baseboard; a plurality of contact devices mounted on at least a subset of the plurality of electronic devices; and a plurality of cooling devices mounted onto at least a subset of the contact devices; wherein each of the contact devices is configured to transfer heat from a corresponding electronic device to a corresponding cooling device.

Also, with the above disclosure a computing rack is disclosed, comprising: a rack housing a plurality of server chassis; a coolant distribution unit delivering coolant liquid to a manifold; a plurality of chassis fans flowing air within the rack; a plurality of baseboard units mounted within the plurality of server chassis, wherein each of the baseboard units comprises a baseboard, a plurality of electronic chips mounted onto the baseboard, a contact layer mounted onto the plurality of electronic chips, and a cooling layer mounted onto the contact layer, wherein the contact layer is configured to transfer heat from the plurality of electronic chips to the cooling layer and the cooling layer is configured to extract and transfer the heat to the cooling air and to the coolant liquid. The cooling layer may comprise a plurality of liquid cooling plates, each circulating coolant fluid from the coolant distribution manifold and may further comprise heat spreaders and dedicated fans configured to receive flowing air from the chassis fans. The cooling layer may also comprise ducts configured to direct air flow from the dedicated fans. The cooling devices of the cooling layer may include one or more of stiffeners, heat spreaders, vapor chamber stiffeners, thermoelectric coolers, and high conductivity plates, with control electronics mounted in the cooling layer and operable to control the cooling devices mounted in the cooling layer.

Figure 9:
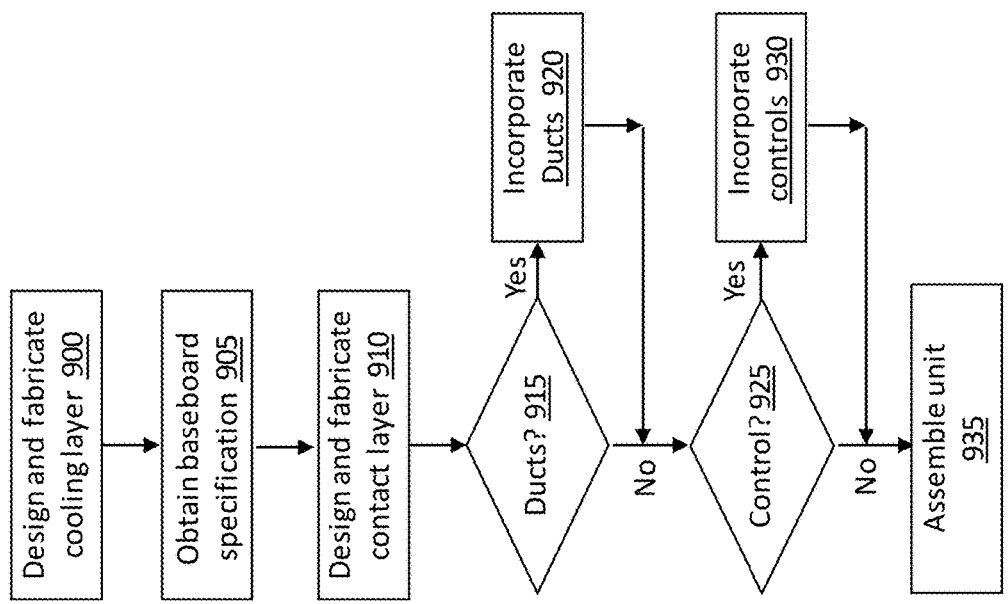
FIG. 9 is a flow chart illustrating a method for fabricating the cooled computing unit according to an embodiment.

FIG. 9 is a flow chart illustrating a process for fabricating a cooled computing unit, according to an embodiment. The order of steps illustrated in FIG. 9 provide only one example, but the order may be changed or reorganized, with certain steps added or deleted as needed. In step 900 of the example of FIG. 9, a cooling layer is designed and fabricated, using an assembly of cooling devices employing passive air cooling, active air cooling, liquid cooling, hybrid cooling. The cooling devices may include heat sinks, cooling fans, liquid cooled cold plates, etc. In step 905 the specification of the electronic devices to be mounted onto the baseboard is obtained. The specification may include physical specification, such as size, height, etc, and thermal specifications, such as operating temperature, Tcase, etc. Using this specification, it is determined which of the cooling devices should be paired with each specific electronic devices, and then a contact device is selected to form the thermal path from the electronic device to the cooling device. The collection of contact devices is then fabricated into a contact layer in step 910.

In step 915 it is determined whether electronic devices on the baseboard require air flow cooling and whether the available air flow may be obstructed by other elements. If so, air ducts may be added to the cooling layer in step 920. Otherwise, in step 925 it is determined whether any of the cooling devices requires control circuitry. If so, such control circuitry may be added to the cooling layer 930. Alternatively, control circuitry may be added to the baseboard, with appropriate connections to the corresponding cooling devices. In step 935 the unit is assembled with the contact layer sandwiched between the baseboard and the cooling layer.

As noted previously, in one embodiment the contact layer is integrated into the electronic device layer, such that the supplier of the completed baseboard includes the contact devices already mounted onto the electronic devices. Then the cooling layer is mounted onto the contact layer. Conversely, in another embodiment the contact layer is first mounted onto the cooling layer, such that the cooling device vendor delivers and integrated solution that includes the cooling layer and the contact layer. This integrated cooling solution is then mounted onto the baseboard.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A baseboard with integrated cooling, comprising:
   a baseboard;
   a plurality of electronic devices mounted onto the baseboard;
   a plurality of contact devices mounted on at least a subset of the plurality of electronic devices, wherein each of the plurality of contact devices has an individual form factor and structure different from other contact devices to match each corresponding electronic device, wherein the plurality of contact devices include at least two of: a heat spreader with a metal cover, a copper stiffener, an alloy steel stiffener, or a vapor chamber stiffener; and,
   a plurality of cooling devices mounted onto at least a subset of the contact devices;
   wherein each of the contact devices is configured to transfer heat from a corresponding electronic device to a corresponding cooling device.

2. The baseboard of claim 1, wherein the plurality of contact devices are arranged as the contact layer between the plurality of electronic devices and the plurality of cooling devices.

3. The baseboard of claim 2, wherein the plurality of cooling devices include heat sinks and liquid cooling cold plate.

4. The baseboard of claim 3, further comprising at least one fan.

5. The baseboard of claim 3, further comprising air ducts.

6. The baseboard of claim 1, further comprising at least one fan oriented to blow air horizontally and at least one fan oriented to blow air vertically.

7. A computing unit, comprising:
   a baseboard;
   a device layer disposed on the baseboard, wherein the device layer comprises a plurality of electronic devices mounted onto the baseboard;
   a contact layer disposed on the device layer, wherein the contact layer comprises a plurality of heat transport devices, each mounted onto one of the electronic devices, wherein each of the plurality of heat transport devices has an individual form factor and structure different from other contact devices to match each corresponding electronic device, wherein the plurality of heat transport devices include at least two of: a heat spreader with a metal cover, a copper stiffener, an alloy steel stiffener, or a vapor chamber stiffener; and a cooling layer disposed on the contact layer, wherein the cooling layer comprises a plurality of cooling devices, each mated to a corresponding one of the heat transport devices, the cooling devices including at least one active air cooling device and one liquid cooling device.

8. The computing unit of claim 7, further comprising control electronics mounted in the cooling layer and operable to control the cooling devices.

9. The computing unit of claim 8, wherein the cooling layer further comprises a plurality of fans coupled to the control electronics.

10. The computing unit of claim 8, wherein the control electronics comprises leak sensor.

11. The computing unit of claim 7, wherein the plurality of heat transport devices comprise one or more of: thermoelectric coolers, and high conductivity plates.

12. The computing unit of claim 7, wherein the plurality of cooling devices comprise one or more of: liquid cooled cold plates, thermoelectric coolers, heat sinks, fins, and fans.

13. The computing unit of claim 7, wherein the cooling layer further comprises at least one fan and ducts configured to direct air flow from the fan.

14. The computing unit of claim 13, wherein the ducts comprise baffles redirecting air flow.

* * * * *